United States Patent
Choi et al.

(10) Patent No.: US 6,483,759 B1
(45) Date of Patent: Nov. 19, 2002

(54) METHODS FOR TESTING A GROUP OF SEMICONDUCTOR DEVICES SIMULTANEOUSLY, AND DEVICES AMENABLE TO SUCH METHODS OF TESTING

(75) Inventors: Ki-hwan Choi, Sungnam-shi; Young-ho Lim, Suwon, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/607,788

(22) Filed: Jun. 30, 2000

(30) Foreign Application Priority Data

Jul. 2, 1999 (KR) .............................................. 99-26594

(51) Int. Cl.⁷ .............................................. G11C 29/00
(52) U.S. Cl. ........................................ 365/201; 365/226
(58) Field of Search .............................. 324/158.1, 758, 324/764, 765; 365/201, 226

(56) References Cited

U.S. PATENT DOCUMENTS

| 4,835,458 | A | * | 5/1989 | Kim ............................ 365/201 |
| 5,381,373 | A | * | 1/1995 | Ohsawa ...................... 365/201 |
| 5,808,947 | A | * | 9/1998 | McClure ..................... 365/201 |
| 6,031,755 | A | * | 2/2000 | Ozawa ........................ 365/201 |

* cited by examiner

*Primary Examiner*—Trong Phan
(74) *Attorney, Agent, or Firm*—Marger Johnson & McCollom, P.C.

(57) ABSTRACT

Semiconductor devices are specially made to be amenable to group testing, with special testing apparatus. The devices include at least one additional pad, and a special circuit that includes at least one fuse. After DC testing, the fuse may be cut if the device is flawed. The power supply is then redirected through the additional pad for subsequent AC testing. The circuit is such that, if the fuse were cut, the device is removed from the group, so as not to affect the other devices of the group. But if the fuse were not cut, the device is included for the AC testing.

9 Claims, 5 Drawing Sheets

US 6,483,759 B1

METHODS FOR TESTING A GROUP OF SEMICONDUCTOR DEVICES SIMULTANEOUSLY, AND DEVICES AMENABLE TO SUCH METHODS OF TESTING

This application relies for priority upon Korean Patent Application No. 1999-26594, filed on Jul. 2, 1999, the contents of which are herein incorporated by reference in their entirety.

FIELD OF THE INVENTION

The present invention relates to a semiconductor memory device and, more particularly, to a test power supply circuit of a semiconductor device.

BACKGROUND OF THE INVENTION

As integration levels of semiconductor chip devices increase, the test time for evaluating the characteristics of a fabricated semiconductor chips also increases. This increases disproportionately the cost of the semiconductor chip. To solve this problem, it is required to simplify the test algorithms and improve testing circumstances.

A recent main method for preventing increase in the test time is a multi-test method. A number of semiconductor chips formed on a wafer are tested at the same time.

Referring to FIG. 1, a conventional wafer has a plurality of semiconductor chips 3 formed on a silicon substrate 1. Direct current (hereafter referred to as "DC") and alternating current (hereafter referred to as "AC") characteristics of each of the semiconductor chips 3 are tested in the test step. Since all are tested simultaneously, this reduces test time.

Scribe lines 5 delineate the boundaries regions between the semiconductor chips 3. After testing, the semiconductor chips 3 are cut from the wafer 1 along the scribe lines 5, and packed.

Based on "Ohm's Law", electric characteristics such as open or short of each of the semiconductor chips 3 (i.e., short or not of power supply voltage $V_{CC}$ and ground voltage $V_{SS}$) are tested at the DC characteristic test operation. Conditions such as power supply voltage margin, timing, and temperature are applied to each of the semiconductor chips 3, thereby testing circuit operation of each of the semiconductor chip 3 and a storage status.

A test system for testing the semiconductor chips 3 tests the DC and AC characteristics of each of the chips 3 through a probe card by loading and then aligning the wafer of these chips. The probe card includes a very fine needle that is fixed on a printed circuit board (PCB). A signal generated from the test system is transferred to each circuit of the semiconductor chips 3 through the needle of the probe card, and a signal generated from a circuit in the semiconductor chip 3 is transferred to the test system through the probe card.

In general, a plurality of (e.g., four) semiconductor chips are simultaneously tested.

Referring to FIG. 2, a physical arrangement is shown for testing 4 devices DUT1 10, DUT2 20, DUT3 30, DUT4 40, which are arranged at the corners of a rectangle. Test-targeted circuits 10, 20, 30, and 40 are tested by connecting power pads $V_{CC}$ and $V_{SS}$, and input/output pads I00, I01, ... I015 with a mutual-sharing arrangement.

During the test operation, a test system supplies power supply voltage $V_{CC}$, ground voltage $V_{SS}$, and input signals I00, I01 ... I015 to the circuits of the chips, through each needle of a probe card and each pad (not shown) of the chips. And, the test system receives the voltages $V_{CC}$ and $V_{SS}$, and output signals O1, O2, ..., O14, and O15 (not shown) through the pad and the needle of the probe card.

The sharing arrangement of the power pads $V_{CC}$ and $V_{SS}$ has to a poignant problem at AC test operation. This is illustrated by assuming that device 20 has a defect, illustrated by resistor R2 as partially shorting VCC and VSS of DUT2 20. The resistor R2 generates a large amount of leakage current. In this case, the power supply voltage $V_{CC}$ supplied to DUT20, and also to the other circuits 10, 30, and 40 goes down to a low level, due to the sharing arrangement.

While this is expected during testing for DC-type defects, it is a big problem while testing for AC-type defects. This causes increase in test time of a semiconductor fabrication device, and considerably reduces a yield of a fabrication process.

SUMMARY OF THE INVENTION

The invention overcomes the problems of the prior art.

The invention provides methods for testing a plurality of semiconductor devices. The devices are connected in a group, and checked for DC-type defects. Those identified to have such a defect are electrically disconnected from the group. Disconnection is by electrical action, while maintaining the physical connection. Thus the defective are also effectively disconnected from further group testing. Then testing in the AC mode is performed. The disconnected devices do not sense the AC testing, and the DC-type defect does not affect the AC testing of the remaining devices.

The method of the invention can be practiced with a number of arrangements. For example, the testing apparatus can have individualized leads that disconnect for individual devices, while permitting the remaining devices to be tested for AC-type defects.

The invention also provides semiconductor devices, which are specially made to be amenable to testing according to the method of the invention. These include additional pads, and a special circuit that include at least one fuse. Disconnection is by cutting the fuse of a device identified to be defective. The subsequent AC testing is by applying the power supply and a ground through the additional pads. The fuse will determine which power is applied to the power line of the device.

A further understanding of the nature and advantage of the invention herein may be realized by reference to the remaining portions of the specification and the attached drawings.

DESCRIPTION OF THE PREFERRED EMBODIMENT

Hereinafter, inventive conception of the invention will be described with reference to attached drawings.

Figure 1:
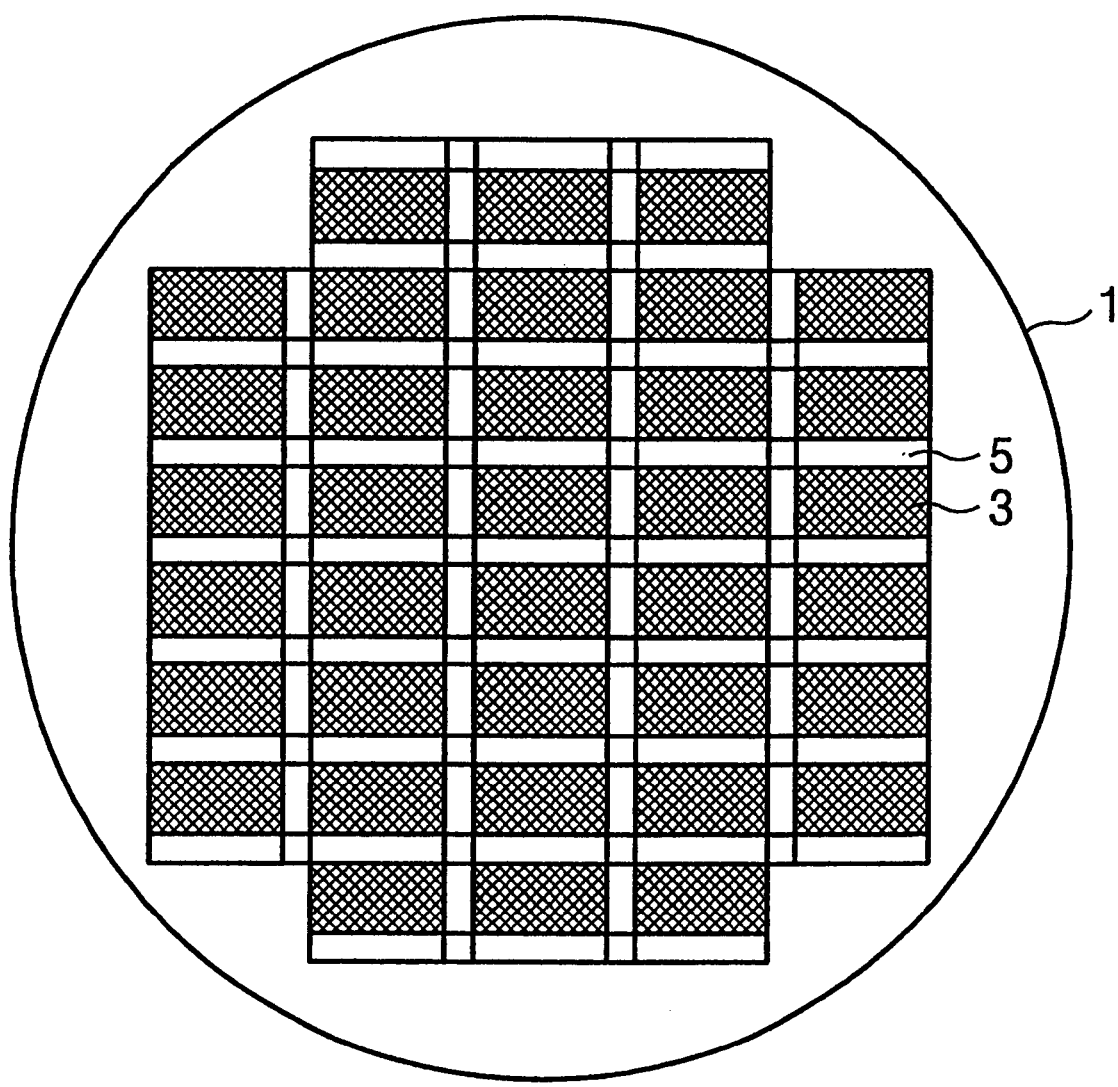
FIG. 1 shows a structure of a conventional wafer.
Figure 2:
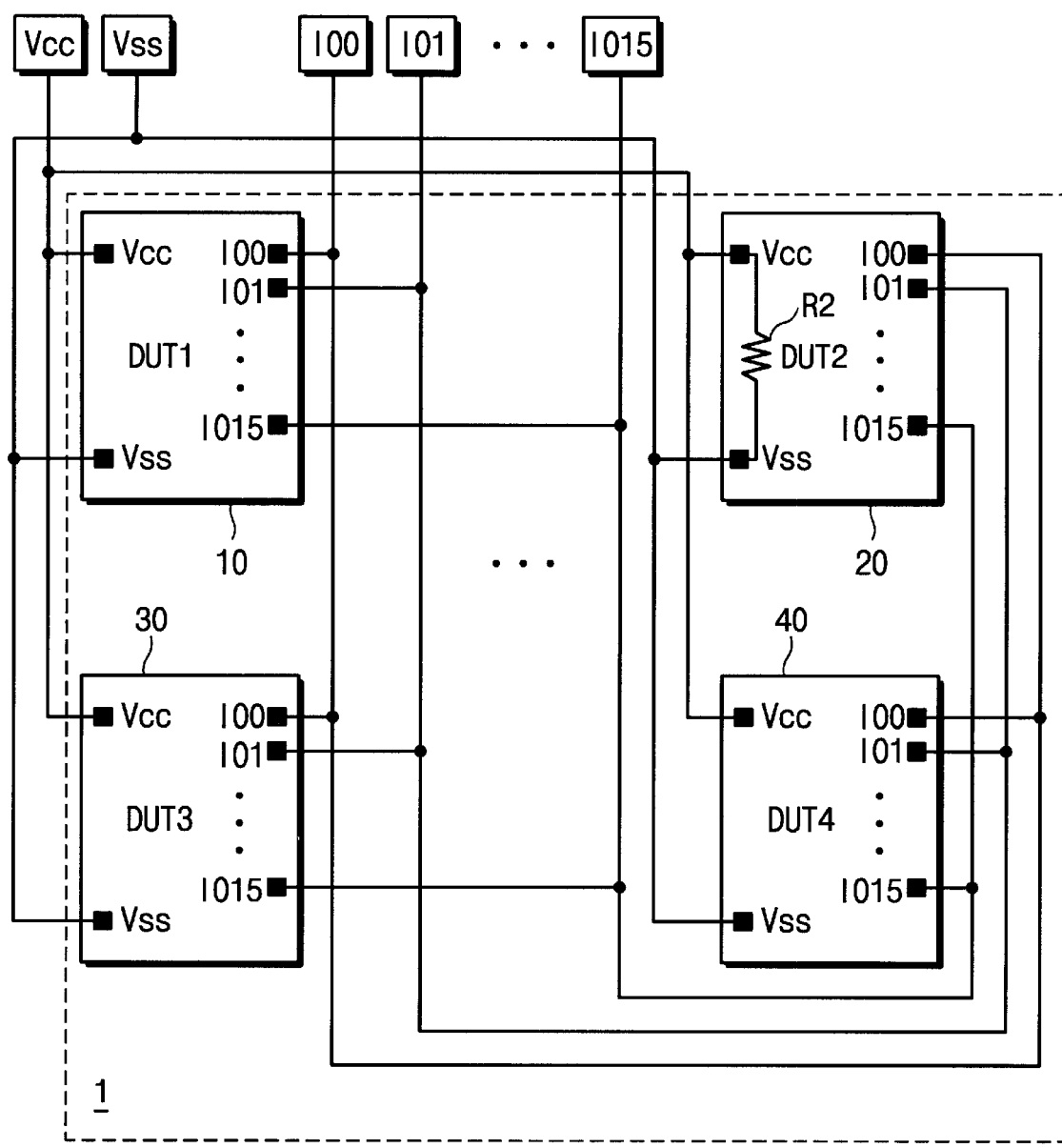
FIG. 2 shows a conventional arrangement for testing four semiconductor devices formed on the wafer of FIG. 1 according to a method in the prior art.
Figure 3:
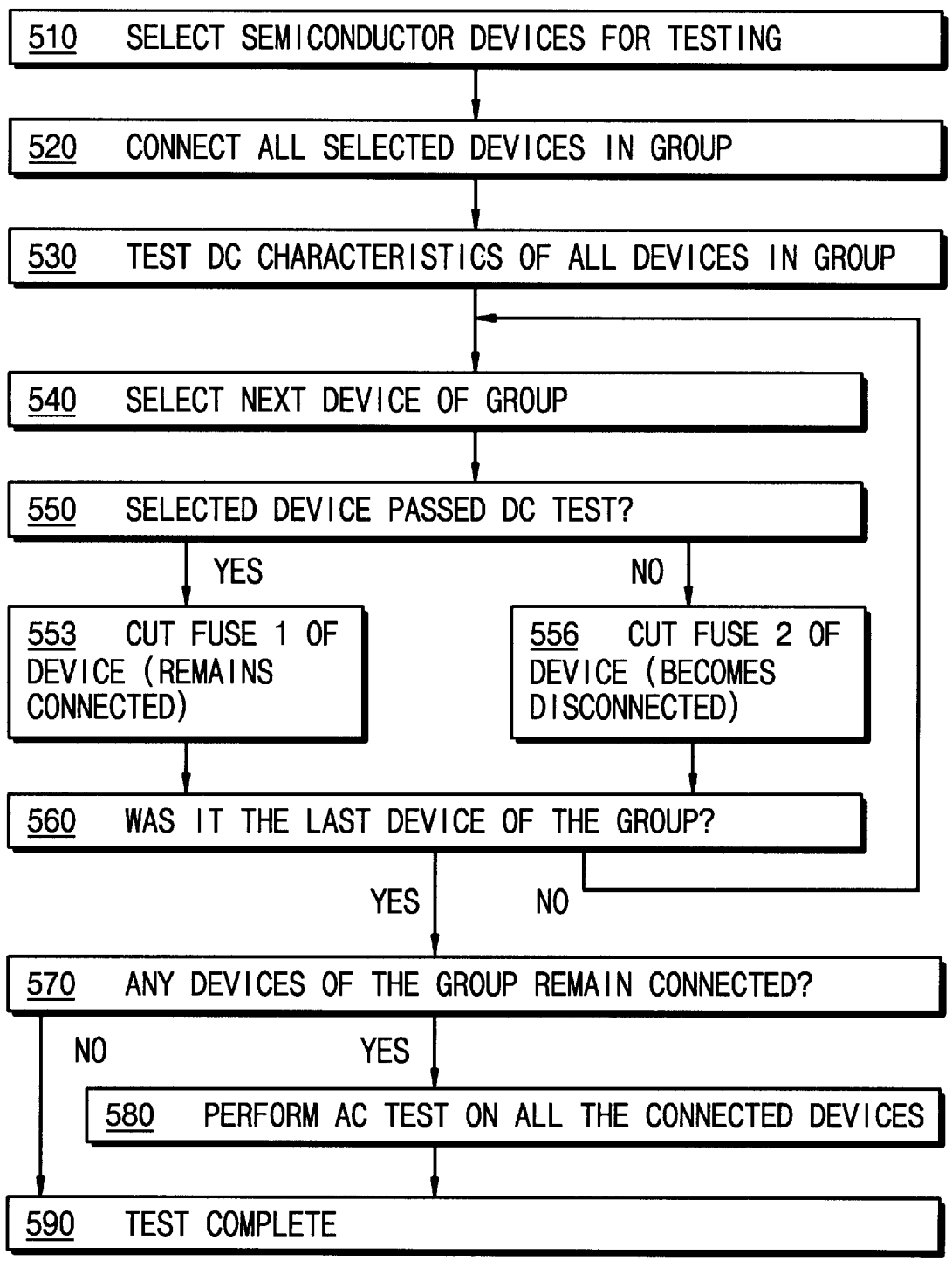
FIG. 3 is a flowchart illustrating a method according to the invention.

As has been mentioned, the invention provides methods for testing a plurality of semiconductor devices. One of the methods is now described with reference to flowchart 500 of FIG. 3.

According to a box 510, semiconductor devices are selected for testing. A good number is four, in a rectangular configuration. The method can be practiced while the devices are still on a chip, to take advantage of their fixed spatial interrelationships.

According to a box 520, all selected devices are connected in a group. By in a group, it is meant that the same power would be applied to respective leads of each selected chip. The advantage of the group is simultaneous testing.

According to a box 530, the DC characteristics of all the devices in the group are tested. More particularly, at least one of the semiconductor devices is tested for effectiveness of a DC characteristic. At least one DC characteristic can be an undesirable DC open circuit. Another DC characteristic can be an undesirable short circuit. This is also known as testing in the DC mode. The DC characteristics are preferably tested simultaneously, exploiting the fact that the devices are connected in a group.

Then the devices are checked to see if they passed testing in the DC mode. More particularly, according to a box 540, a next device of the group is selected. According to a box 550, it is inquired whether the selected device passed the DC test. If not, the device is effectively disconnected from the group, and thus also from further group testing.

The preferred way to disconnect is, according to a box 556, by cutting a second fuse of the tested semiconductor device itself. This is applicable where the device is specially made according to the invention, to accommodate this method of invention. In addition, if the device passed the DC tests, it is preferred according to a box 553 to cut a first fuse of the device. This keeps the device connected within the group, for subsequent group testing in the AC mode.

Then according to a box 560, it is inquired whether the selected device was the last one of the group. If not, then execution returns to box 540, for the next device. If yes, execution proceeds to a box 570.

When all the devices have been examined as to whether they passed the DC tests, then according to box 570, it is inquired whether any of the devices of the group remain connected. If not, then according to a box 590 the test is complete. There is no need to perform any AC testing afterwards, because all the devices have failed testing into DC mode. While it is statistically improbable that four out of four devices will have DC-type defects, box 570 is included here for completeness.

If at least one device has passed testing in the DC mode, then according to box 580, AC testing is performed on all the devices that are still connected. AC testing can be simultaneous on all the remaining devices, and can include signal input/output testing. The devices that have been disconnected due to DC type defects do not affect AC testing. Then execution proceeds again to box 590.

The method of the invention can be practiced with a number of arrangements. For example, the testing apparatus can have individualized leads that disconnect for individual devices, while permitting the other devices to be tested for AC-type defects.

The invention also provides semiconductor devices, which are specially made to be amenable to testing according to the method of the invention. Devices and test arrangements according to the invention are now described with reference to FIG. 4 and FIG. 5.

Figure 4:
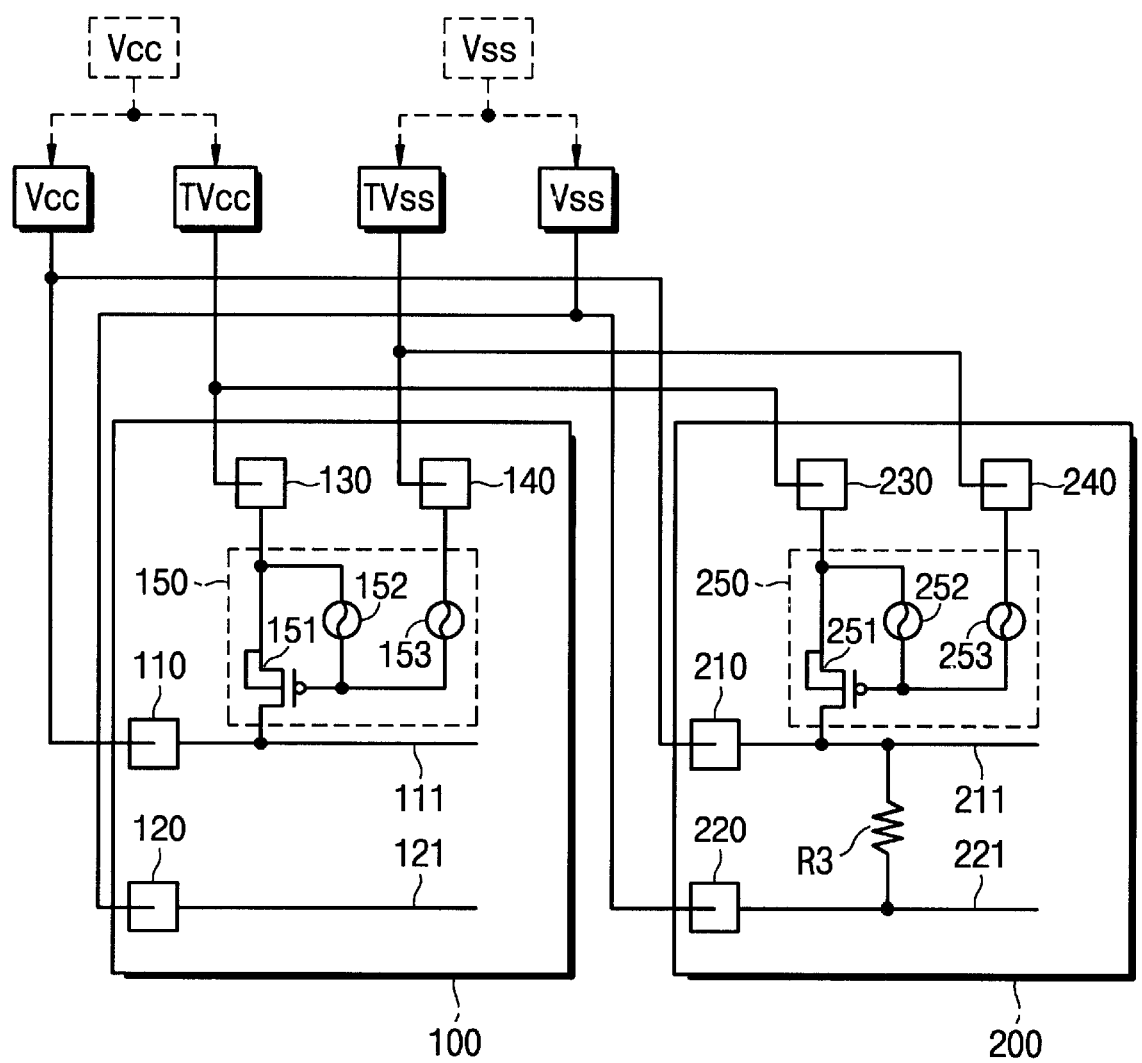
FIG. 4 is a circuit diagram of a test power supply circuit in two semiconductor devices made according to the present invention to work with the method of the invention.

Referring to FIG. 4, two semiconductor devices 100, 200 made according to invention are shown. Devices 100, 200 are semiconductor chips intended for testing. These can be Dynamic Random Access Memories (DRAM), Static Random Access Memories (SDRAM), Non Volatile Memories (NVM), or Application Specific Integrated Circuits (ASIC).

Devices 100, 200 are identical, except that, while device 100 is flawless, device 200 has a DC type defect that would be discovered while testing in the DC mode. In particular, the defect the shown as resistor R3. In addition, both are shown so as to partially elucidate some of the group connections, and the difference between a defective and a proper circuit.

Devices 100, 200 are now described in detail. Device 100 has four pads 110, 120, 130, 140. Similarly, device 200 has four pads 210, 220, 230, 240. Each of the devices 100, 200 has additional pads, which are not shown in FIG. 4.

Pad 110 receives from the exterior a first power (VCC), and transfers it to a first power line 111 that communicates with the interior of the chip. (Similarly, pad 210 for the first power line 211 of device 200.) Pad 120 receives from the exterior a second power (VSS or ground), and transfers it to a second power line 121 that communicates with the interior of the chip. (Similarly, pad 220 for the second power line 221 of device 200.)

During the DC test operation, the first pad 110 (210) transfers a first power $V_{CC}$ from a test system to a first power line 111 (211), and the second pad 120 (220) transfers a second power $V_{SS}$ to a second power line 121 (221). It will be appreciated that the defect, in the form of resistance R3, will affect current flow in the second device 200, and also in the subsequent AC testing.

In addition, each of devices 100, 200 has a third and fourth pad according to the invention. During the AC test operation after the DC test operation, the third pad 130 receives a third power $TV_{CC}$ transferred through the probe card, and the fourth pad 140 receives a fourth power $TV_{SS}$ transferred through the probe card. The third pad is for transferring the first power to the first power line 111 during subsequent testing in an AC mode, if the earlier testing in the DC mode was successful. The fourth pad is for transferring the second power to the first power line 211 during testing in the AC mode, if the earlier testing in the DC mode was not successful.

Devices 100, 200 also include test power transfer means, in the form of circuits 150, 250, respectively. These are also called a selection means, for selectively coupling one of the third pad and fourth pad with the first power line, in accordance with whether the earlier testing in the DC mode was successful.

In the general preferred embodiment, the test power transfer means includes fuses. In particular, circuit 150 includes fuses 152 and 153, and circuit 250 includes fuses 252 and 253. Each fuse has two terminals, one of which is coupled with the first power line. In addition, one of the fuses is coupled by the other terminal to the third pad, and the other fuse to the fourth pad. One of the fuses is cut, depending on whether testing in the DC mode was successful or not. It will be appreciated that, in the general embodiment, cutting one of the two fuses permits the other fuse to apply the voltage of its associated pad to the first power line.

Each device 100, 200 is initially manufactured with all its fuses intact. It is preferred that the first pad in each case is isolated from the respective fourth pad. That is why each of circuits 150, 250, preferably additionally includes a switch circuit 151, 251, respectively. In each case, the switch circuit is advantageously connected between the first power line and the second terminals of the first and the second fuses. This way the switch circuit selectively couples one of the third pad and the fourth pad to the first power line (in accordance with cutting of one of the fuses), while concurrently isolating the first pad from the fourth pad.

In the preferred embodiment, the switch circuit includes a transistor having a current path formed between the first power line and the third pad, and a gate commonly connected to the second terminals of the first and the second fuses. In the embodiment of FIG. 4, the transistor is a PMOS transistor, and the first fuse is cut if testing in the DC test mode was successful, and the second fuse is cut if testing in the DC test mode was not successful.

In the DC test mode, the DC characteristics of semiconductor chips 100, 200 are tested. During the DC test mode, a voltage VCC is applied to the first pads 110, 210. In addition, a second voltage VSS is applied to the second pads 120, 220.

Then it is determined which, if any, chips have DC-type defects. In the example of FIG. 4, chip 100 does not, while chip 200 has resistance R3 between power lines 211 and 221.

Once the defective chips are identified, they are disconnected from the group as described above. In this embodiment, disconnecting is accomplished by cutting the second fuse 253 of chip 200. Cutting is preferably by laser. As will be seen from the below, cutting the second fuse 253 further damages the chip 200. That is not a problem, however, because chip 200 was already defective and will be discarded.

Further according to the invention, the first fuse 152 of chip 100 is also cut. This does not damage the chip 100, and maintains it in the group for further testing.

Then the AC mode is tested. For that, the power supply voltage VCC is no longer applied to the first pads 110, 210. Instead, a power supply voltage TVCC is applied to the third pads 130, 230. Preferably power supply voltage TVCC is similar to VCC, although that is not necessary. In addition, a voltage TVSS, also known as a second power, is applied to the fourth pads 140, 240. Preferably voltage TVSS is similar to ground voltage VSS, although that is not necessary. In each case, the voltage reaching the first power lines 111, 211, depends from test power transfer circuits 150, 250, respectively.

It is now explained why cutting the second fuse 253 disconnects defective chip 200 from its group, while cutting the first fuse 152 of chip 100 keeps it in the group. In both cases the drain of PMOS transistors 151, 251 supplies the first power lines 111, 211 respectively.

In chip 100, third pad 130 receives a supply voltage TVCC. Since fuse 152 is cut, the supply voltage TVCC does not reach the drain of PMOS transistor 151. Additionally, fourth pad 140 receives a ground voltage TVSS, and transmits it through the intact second fuse 153 to the gate of the PMOS transistor 151. This turns on transistor 151, which in turn allows the supply voltage TVCC from third pad 130 to reach the first power line 111.

In chip 200, third pad 230 receives a supply voltage TVCC. The supply voltage TVCC reaches, through the intact first fuse 252, the gate of PMOS transistor 251, and turns it off. While the fourth pad 140 receives a ground voltage TVSS, that does not reach the gate of PMOS transistor 251, because the second fuse 253 is cut. Since the transistor is turned off, the PMOS transistor 251 acts as a diode. No supply voltage reaches the first power line 211.

Accordingly, while the AC test operation is taking place, power is not applied to defective chip 200. This enables AC testing of chip 100 without a problem, which reduces test time and improves the yield of the semiconductor fabrication process.

Figure 5:
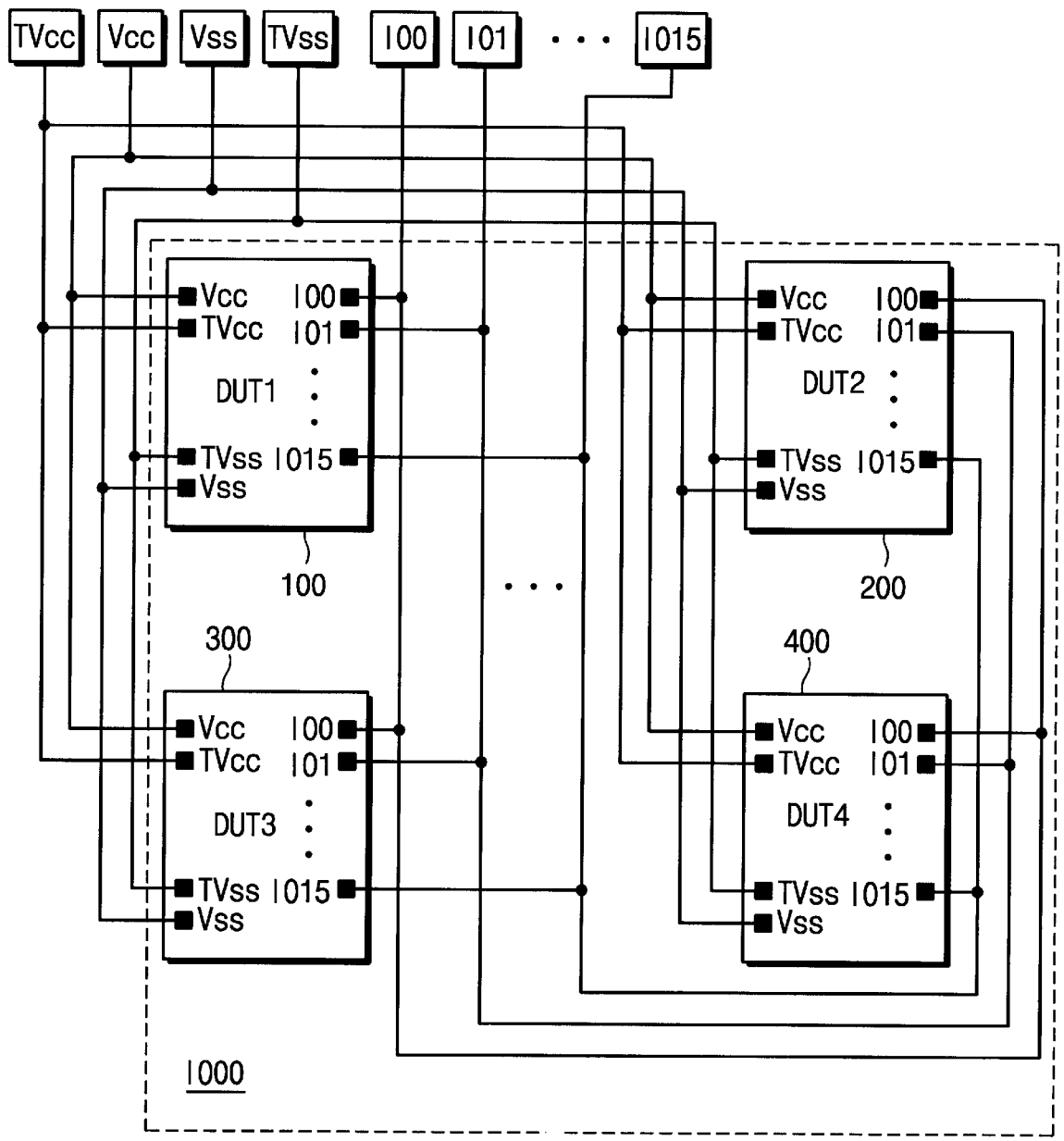
FIG. 5 shows a physical arrangement for testing the semiconductor devices of FIG. 4 in a group with another 2 devices in accordance with the invention.

Referring now to FIG. 5, a physical testing configuration is described. Semiconductor chips 100, 200 (described in FIG. 4), are shown along with chips 300, 400. They are shown while still on a wafer 1000 where they were formed, although that is not necessary. Each of the chips 100, 200, 300, 400 of the invention has been manufactured by an identical process, although some may have defects. The chips are shown with their pads for VCC, VSS, TVCC, TVSS, along with pads I00, I01, . . . and I015.

The method of the invention can be applied on the device of FIG. 5. The testing arrangement includes additional leads for TVCC and TVSS, along with leads for testing each of the IO pads. Not all the leads are shown.

The chips are simultaneously tested by a test system (not shown) during a wafer step. During a DC test operation, a first power VCC is transferred to the first pads VCC of the chips, and a second power VSS is transferred to the second pads VSS of the chips.

Then those chips identified to have DC-type defects (e.g. chip 200) are disconnected. Such can be by cutting fuses of the chips, as described above. In addition, fuses of non-defective chips can be cut.

Then AC type testing takes place. At the AC test, tested are circuit operation of each of the semiconductor chips 100, 200, 300, and 400 and storage status of data. Further, an address or input data is applied through input/output pads I00, I01, . . . and I015 of the chips 100, 200, 300, and 400, testing the AC characteristic of the normal semiconductor chips 100, 300, and 400.

During AC testing, the first power VCC is not applied through the first pads VCC, but a third power TVCC is applied through the third pads TVCC, and a fourth power TVSS is applied through the fourth pads TVSS. In each case, the devices under test DUT1, DUT2, DUT3, DUT4 will receive at their power line either TVCC or TVSS, depending on whether they remain in the group or not.

As mentioned above, a semiconductor device of this invention comprises a test power supply circuit which selectively transfers a test power voltage during test operation in accordance with defect or not of a semiconductor chip. During AC test operation, the test power supply circuit is used to interrupt power supply to a chip in which DC defect is generated. Thus, the AC test of normal chips is performed without problems, which reduces test time and improve a yield of a semiconductor fabrication process.

A person skilled in the art will be able to practice the present invention in view of the description present in this document, which is to be taken as a whole. Numerous details have been set forth in order to provide a more thorough understanding of the invention. In other instances, well-known features have not been described in detail in order not to obscure unnecessarily the invention.

While the invention has been disclosed in its preferred form, the specific embodiments thereof as disclosed and illustrated herein are not to be considered in a limiting sense. Indeed, it should be readily apparent to those skilled in the art in view of the present description that the invention can be modified in numerous ways. The inventor regards the subject matter of the invention to include all combinations and subcombinations of the various elements, features, functions and/or properties disclosed herein.

The following claims define certain combinations and subcombinations, which are regarded as novel and non-obvious. Additional claims for other combinations and subcombinations of features, functions, elements and/or properties may be presented in this or a related document.

What is claimed is:

1. A semiconductor memory device comprising:

a first pad for transferring a first power to a first power line during testing in a DC mode;

a second pad for transferring a second power to a second power line during testing in the DC mode; and a third pad for transferring the first power to the first power line during subsequent testing in an AC mode, if testing in the DC mode was successful.

2. The device of claim 1, further comprising:

a fourth pad for transferring the second power to the first power line during testing in the AC mode, if testing in the DC mode was not successful.

3. The device of claim 2, further comprising:

selection means for selectively coupling one of the third pad and the fourth pad with the first power line in accordance with whether testing in the DC mode was successful.

4. The device of claim 3, wherein the selection means includes:

a first fuse having a first terminal coupled with the third pad; and a second fuse having a first terminal coupled with the fourth pad, wherein one of the first and second fuses is cut depending on whether testing in the DC mode was successful.

5. The device of claim 4, wherein the selection means further includes:

a switch circuit, connected between the first power line and second terminals of the first and the second fuses, for selectively coupling one of the third pad and the fourth pad to the first power line in accordance with cutting of one of the first fuse and the second fuse, while isolating the first pad from the fourth pad.

6. The device of claim 5, wherein the switch circuit includes a transistor having a current path formed between the first power line and the third pad, and a gate commonly connected to the second terminals of the first and the second fuses.

7. The device of claim 6, wherein the transistor is a PMOS transistor, and the first fuse is cut if testing in the DC test mode was successful, and the second fuse is cut if testing in the DC test mode was not successful.

8. The device of claim 1, wherein the first power line is a power supply voltage line.

9. The device of claim 1, wherein the second power line is a ground voltage line.

* * * * *